United States Patent
Tezuka

(10) Patent No.: US 6,407,406 B1
(45) Date of Patent: Jun. 18, 2002

(54) SEMICONDUCTOR DEVICE AND METHOD OF MANUFACTURING THE SAME

(75) Inventor: Tsutomu Tezuka, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/342,595

(22) Filed: Jun. 29, 1999

(30) Foreign Application Priority Data

Jun. 30, 1998 (JP) .......................................... 10-185132

(51) Int. Cl.$^7$ ..................... H01L 29/06; H01L 31/0328; H01L 31/0336; H01L 31/072; H01L 31/109
(52) U.S. Cl. ............................. 257/18; 257/19; 257/190
(58) Field of Search ................................ 257/190, 192, 257/18, 20, 19, 616

(56) References Cited

U.S. PATENT DOCUMENTS

| | | | | |
|---|---|---|---|---|
| 4,710,788 A | * | 12/1987 | Dambkes et al. ............ | 257/190 |
| 5,155,571 A | * | 10/1992 | Wang et al. ................. | 257/190 |
| 5,461,243 A | | 10/1995 | Ek et al. ...................... | 257/190 |
| 5,534,713 A | * | 7/1996 | Ismal et al. .................. | 257/19 |

FOREIGN PATENT DOCUMENTS

| | | |
|---|---|---|
| JP | 9-180999 | 7/1997 |
| JP | 10-308513 | 11/1998 |

OTHER PUBLICATIONS

T. Tezuka et al., "Two Types of Growth Mode for Ge Clusters on Si(100) Substrate with and Without Atomic Hydrogen Exposure Prior to the Growth", Journal of Appl. Physics, vol. 83, No. 10, pp. 5239–5243, May, 15, 1998.

A.R. Powell et al., "New apprpach to the growth of low dislocation relaxed SiGe material," Appl. Phys. Lett., vol. 64, No. 14, pp. 1856–1858, (1994).

A.J. Steinfort et al., "Strain in Nanoscale Germanium Hut Clusters on Si(001) Studied by X–Ray Diffraction," Physical Review Letters vol. 77, No. 10, pp. 2009–2012, (1996).

* cited by examiner

Primary Examiner—Steven Loke
Assistant Examiner—Shouxiang Hu
(74) Attorney, Agent, or Firm—Finnegan, Henderson, Farabow, Garrett & Dunner, L.L.P.

(57) ABSTRACT

An undoped Ge sacrificial layer with an uneven surface (about 1 nm), a relaxed undoped $Si_{0.7}Ge_{0.3}$ buffer layer (50 nm), an n-type $Si_{0.7}Ge_{0.3}$ carrier supply layer, an undoped $Si_{0.7}Ge_{0.3}$ spacer layer, an undoped strained Si channel layer (10 nm), an undoped $Si_{0.7}Ge_{0.3}$ cap layer (20 nm), and an undoped strained Si cap layer (2 nm) are sequentially stacked on a p-type Si substrate. Therefore, a buffer layer can be made thin and of low dislocation density since a semiconductor device has a strained semiconductor layer applied with a tensile strain or a compressive strain.

2 Claims, 4 Drawing Sheets

SEMICONDUCTOR DEVICE AND METHOD OF MANUFACTURING THE SAME

BACKGROUND OF THE INVENTION

The present invention relates to a semiconductor device having a high operation speed and low power consumption and a method of manufacturing the same and, more particularly, to a semiconductor device having a semiconductor layer with a tensilely strain or compression strain applied to its interior or surface and a method of manufacturing the same.

Along with today's size reduction of electronic devices and information terminals, a strong demand for reducing power consumption of electronic devices without lowering the operation speed has arisen. Reduction of power consumption of any electronic devices, to say nothing of portable information devices, is a great challenge from the viewpoint of preservation of the environment and energy resources.

A conventional electronic circuit uses bulk Si as a substrate and have met the above requirement by reducing the device size. However, miniaturization of a device has a physical and economical limitation, and a technique of increasing the operation speed and reducing power consumption without miniaturization must be established.

The electron state near the Fermi level of n-type unstrained Si that is conventionally used for an electronic device such as a ULSI degenerate sixfold. For this reason, as shown in FIG. 1, electrons present in a certain valley (in a wave number space, the region of an equal-energy surface of electrons at the Fermi energy $E_F$) are scattered to the remaining five valleys by phonons. Such valley scattering decreases mobility of electrons.

When a tensile strain is applied to a Si thin film in a plane parallel to a surface of a (001) substrate, the electron state having an energy near $E_F$ is separated into a ground state with double degeneracy and an excited state with quadruple degeneracy. When the electron distribution is not excessively deviated from the Fermi distribution (for example, when no high field is applied), most electrons stay in the ground state with double degeneracy. An inter-valley scattering of electrons exclusively occurs in the wave number space between the two valleys. As a result, the mobility in the direction of plane increases. Hence, when a Si layer to which, e.g., a tensile strain is applied is used for the channel of an n-MOSFET, operation at a higher speed than that of a conventional Si n-MOSFET can be expected.

On the other hand, when such a strained Si layer or a compressively-strained SiGe layer formed on a Si substrate is used as a hole channel, mobility of holes increases due to the decrease in hole mass or lifting of the degeneracy of the valence band, as is pointed out. Consequently, an increase in operation speed of a p-MOSFET or p-MODFET can be expected. In both cases, a high-speed operation more than Si can be expected even at a similar or lower operation voltage than that of a conventional Si device. This suggests possibility of simultaneously realizing high-speed operation and low power consumption.

Tensilely strained Si is obtained by epitaxially growing Si on a crystal having a lattice constant larger than that of Si. Usually, a lattice-relaxed SiGe buffer layer is grown on a Si substrate, and a Si thin film is grown on the buffer layer.

However, to obtain a lattice-relaxed SiGe surface having a low dislocation density, a buffer layer as thick as several $\mu$m is required. If the buffer layer is thin, the compressive strain remains on the surface of the SiGe layer, which results in an insufficient strain amount or dislocation density becomes very high though lattice relaxation is sufficient.

However, formation of a thick buffer layer requires a very long time of several ten minutes to several hours. Therefore, a problem arises in that the throughput decreases or large amounts of source gas are consumed. Furthermore, when a strained Si MOS region and a normal Si-MOS region are to be formed on one substrate, a large step of several $\mu$m is generated due to the thick SiGe buffer layer. This makes a process such as lithography or electrode formation difficult.

In recent years, a technique of forming MOSFETS on an SOI substrate is used to decrease the parasitic capacitance and increase the operation speed. A thick SiGe buffer layer does not match this technique. In addition, when a SiGe buffer layer is made thick, the p-n junction area increases to increase the parasitic capacitance, so the SOI substrate is useless.

Especially, in manufacturing an integrated circuit, the requirement becomes more serious in terms of yield and uniform characteristics. The dislocation density need be suppressed to $1.0 \times 10^3$ cm$^{-2}$ or less. However, in the conventional technique, the dislocation density on the SiGe buffer layer surface is as high as $10^4$ to $10^7$ cm$^{-2}$, and an integrated circuit is difficult to realize.

As described above, when a thick SiGe buffer layer is formed, the throughput decreases and large amounts of source gas are consumed. Therefore, manufacturing cost increases. In addition, since a large step is generated in the thick buffer layer, the process such as lithography or electrode formation is difficult.

The dislocation density of the buffer layer must be suppressed to $1.0 \times 10^3$ cm$^{-2}$ or less. However, the dislocation density on a SiGe buffer layer obtained by the conventional technique is as high as $10^4$ to $10^7$ cm$^{-2}$, and an integrated circuit is difficult to realize.

BRIEF SUMMARY OF THE INVENTION

It is an object of the present invention to provide a semiconductor device which has a strained semiconductor layer applied with a tensile or compressive strain, and also has a low dislocation density and a sufficiently thin buffer layer, and is capable of realizing high-speed operation and low power consumption, and a method of manufacturing the semiconductor device.

In order to achieve the above object, according to the first aspect of the present invention, there is provided a semiconductor device comprising: a first semiconductor layer; a second semiconductor layer formed on the first semiconductor layer, wherein the second semiconductor layer has an uneven surface and has a lattice constant different from that of the first semiconductor layer; a buffer layer formed on the uneven surface of the second semiconductor layer; and a strained semiconductor layer formed above the buffer layer, wherein the strained semiconductor has a lattice constant different from that of the buffer layer.

According to the second aspect of the present invention, there is provided a semiconductor device comprising: a $Si_{1-x}Ge_x$ ($1 \geq x > 0$) layer formed on a silicon substrate, wherein the $Si_{1-x}Ge_x$ layer has an uneven surface; a $Si_{1-y}Ge_y$ ($x \neq y$) buffer layer formed on the uneven surface of the $Si_{1-x}Ge_x$ layer; and a strained $Si_{1-z}Ge_z$ ($z \neq y$) layer formed above the $Si_{1-y}Ge_y$ layer.

Preferably, $x > y > z$, or $x > y$ and $z > y$.

The average film thickness of the $Si_{1-x}Ge_x$ ($1 \geq x > 0$) layer is preferably 1 to 5 nm.

The $Si_{1-z}Ge_z$ layer is used as a channel of electrons or holes.

According to the third aspect of the present invention, there is provided a method of manufacturing a semiconductor device, comprising: forming, on a first semiconductor layer, a second semiconductor layer having an uneven surface and a lattice constant different from a lattice constant of the first semiconductor layer; forming a buffer layer in an amorphous state on the uneven surface of the second semiconductor layer; annealing the buffer layer in the amorphous state to crystallize the buffer layer; and forming a strained semiconductor layer above the buffer layer.

The second semiconductor layer having an uneven surface is formed in the so-called Stranski-Krastanov growth mode in which islands are sponstaneously formed so as to relax lattice mismatching with the semiconductor substrate.

The present invention with the above arrangements has the following functions and effects.

When the second semiconductor layer having an uneven surface is formed on the first semiconductor layer, stresses are accumulated in the boundary region between convex portions, so crystal defects can be generated around the region. When the buffer layer in the amorphous state is deposited on the resultant structure and annealed, crystallization starts from a region in contact with the second semiconductor layer. A strain energy is accumulated as crystallization progresses. When the strain energy exceeds a certain critical value, dislocation is generated near the boundary region from the interface between the crystal layer and amorphous layer toward the second semiconductor layer.

When crystallization further progresses, due to the above dislocation, dislocations parallel to the substrate grow between convex portions. The generation of the threading dislocation reaching the surface of the crystal layer is suppressed due to the dislocation network generated in the island structure region parallel to the substrate at a high density. Since the lattice constant difference between the buffer layer and first semiconductor layer is absorbed by the dislocation, a sufficiently relaxed buffer layer having a low dislocation density can be obtained.

If the buffer layer is directly formed by an epitaxial growth on the second semiconductor layer having an uneven surface, the surface of the buffer layer also could be uneven, and a process for planarizing the surface is required. However, as in the present invention, by the deposition of the amorphous buffer layer and the subsequent annealing, a crystalline buffer layer having a flat surface can be obtained because the uneven structure is not reflected on the amorphous structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the accompanying drawing.

[First Embodiment]

Figure 1:
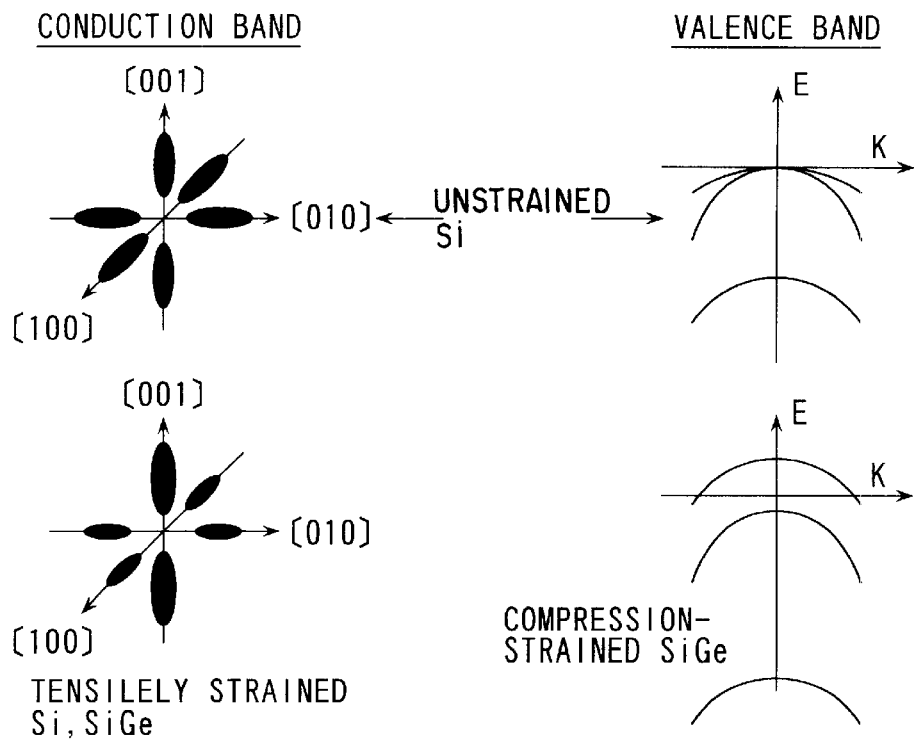
FIG. 1 is a view showing an electron state near the Fermi level of Si.
Figure 2:
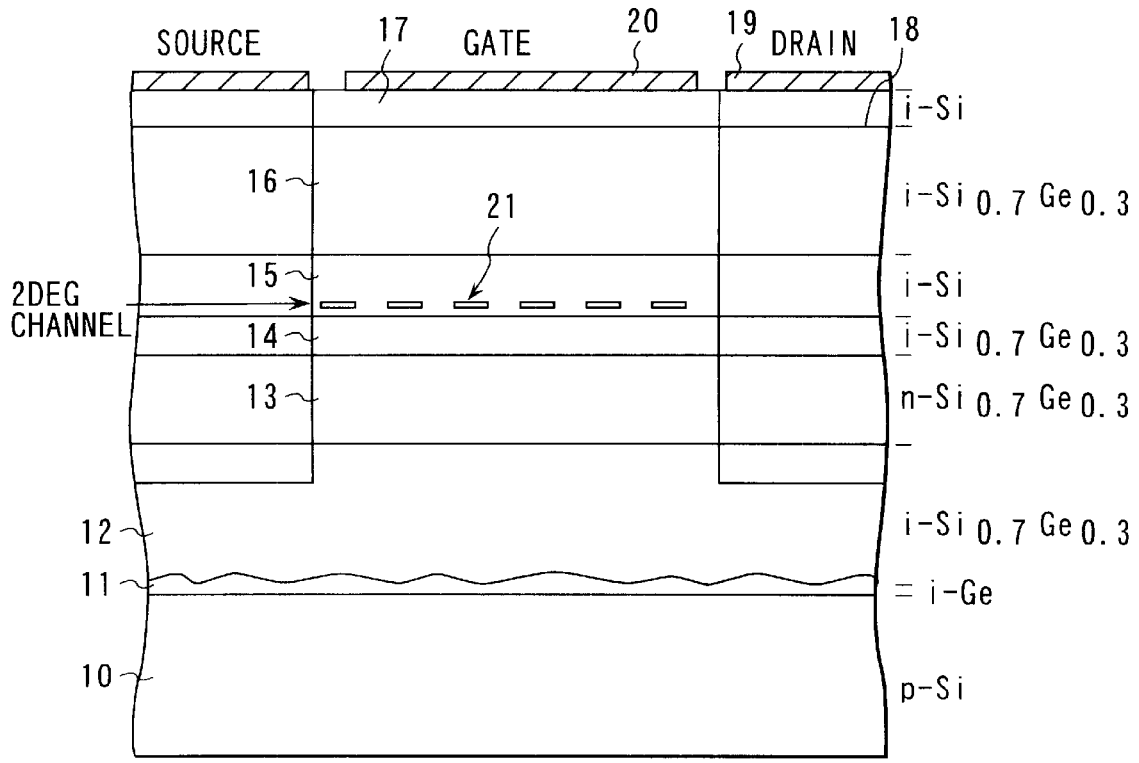
FIG. 2 is a sectional view showing a semiconductor device according to the first embodiment.

FIG. 2 is a sectional view showing a semiconductor device according to the first embodiment of the present invention. This embodiment is associated with an n-type modulation doped field effect transistor (nMODFET) using a strained Si channel.

An undoped Ge sacrifice layer (second semiconductor layer, $Si_{1-x}Ge_x$ ($1 \geq x > 0$) layer) 11 with an uneven surface of 6 mono-layers (average thickness: about 1 nm)), a relaxed undoped $Si_{0.7}Ge_{0.3}$ buffer layer (third semiconductor layer, $Si_{1-y}Ge_y$ ($x \neq y$) layer) (50 nm) 12, an n-type $Si_{0.7}Ge_{0.3}$ carrier supply layer (n=4.0×10$^{18}$ cm$^{-3}$, 10 nm) 13, an undoped $Si_{0.7}Ge_{0.3}$ spacer layer (2.5 nm) 14, an undoped strained Si channel layer (strained semiconductor layer, $Si_{1-z}Ge_z$ ($z \neq y$) layer) (10 nm) 15, an undoped $Si_{0.7}Ge_{0.3}$ cap layer (20 nm) 16, and an undoped strained Si cap layer (2 nm) 17 are sequentially stacked on a p-type Si substrate (first semiconductor layer) 10.

A source and a drain are formed from n-type diffusion regions 18 by ion implantation and annealing, and Al electrodes 19 formed on the n-type diffusion regions 18. A Schottky gate electrode 20 is formed from Pt (20 nm)/Ti (20 nm)/Al (200 nm) on the Si cap layer 17 in the region sandwiched by the Al electrodes 19.

In the first embodiment, a strain due to lattice mismatching between the Si substrate 10 and buffer layer 12 is absorbed by dislocation generated in the sacrifice layer 11 parallel to the substrate 10 and substantially completely relaxed. For this reason, a sufficient tensile strain is applied to the strained Si channel layer 15, and a two-dimensional electron gas channel 21 is formed near the interface between the spacer layer 14 and channel layer 15.

Figure 3A:
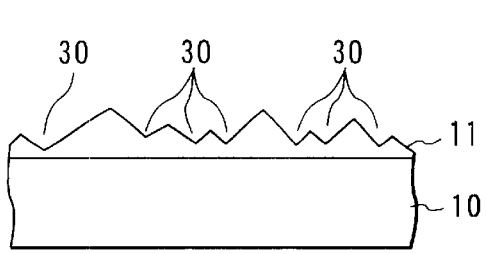
FIGS. 3A, 3B, 3C and 3D are sectional views showing steps in manufacturing the semiconductor device shown in FIG. 2.
Figure 3B:
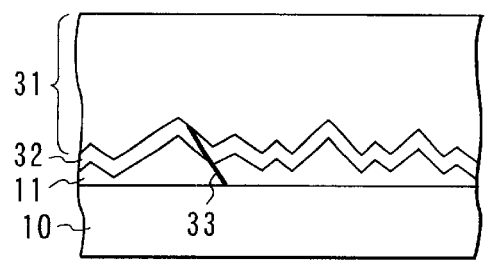
Figure 6:
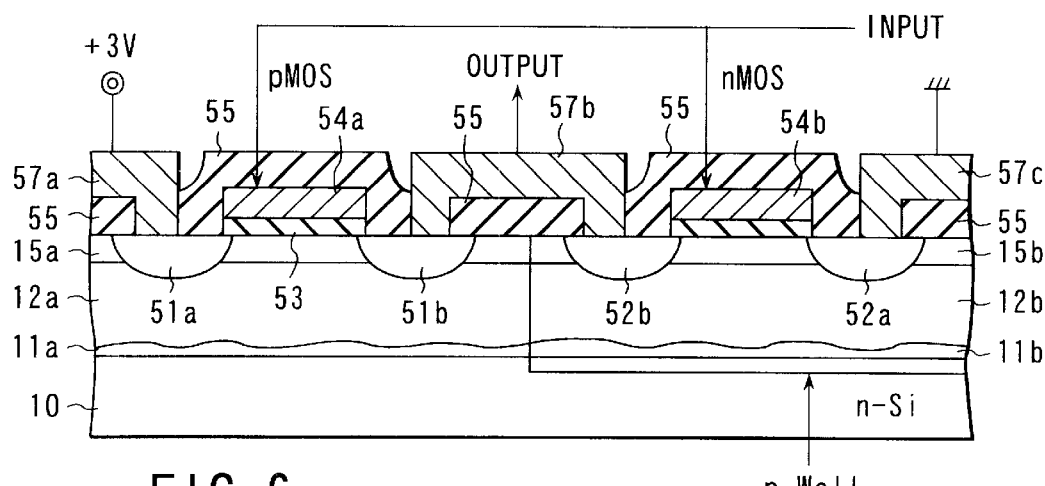
FIG. 6 is a sectional view showing the arrangement of a semiconductor device according to the second embodiment.

A method of manufacturing the semiconductor device shown in FIG. 2 will be described next with reference to FIGS. 3A to 3D. First, as shown in FIG. 3A, 6 ML (mono-layers) of Ge is supplied onto the Si substrate 10 by CVD to form the Ge sacrifice layer 11 with an average thickness of 1 nm. The substrate temperature is 500° C. The Ge sacrifice layer 11 grows in the form of islands due to lattice mismatching with the substrate. The island structures with a base area of 20 nm×20 to 100 nm and a height of about 2 nm are tightly adjacent to each other. Hence, the Ge sacrifice layer 11 has an uneven surface as shown in the cross section of AFM (atomic-force microscope) image in FIG. 4.

Figure 5:
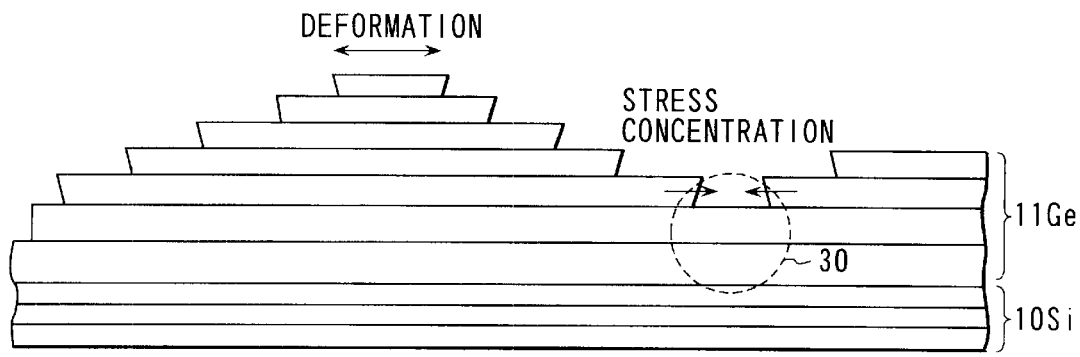
FIG. 5 is a view for explaining the state of the Ge sacrifice layer.

FIG. 5 shows the state of the strain in the island structure of the Ge sacrifice layer 11. As shown in FIG. 5, the strain near the peak of an island of the Ge sacrifice layer 11 can be relaxed to some extent by deformation in the lateral direction. However, stress concentrates to the bottom portion and, more particularly, to a boundary region 30 between islands.

Figure 3C:
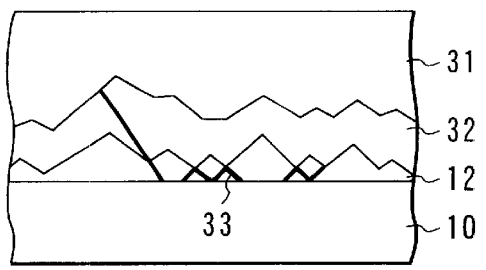
Figure 3D:
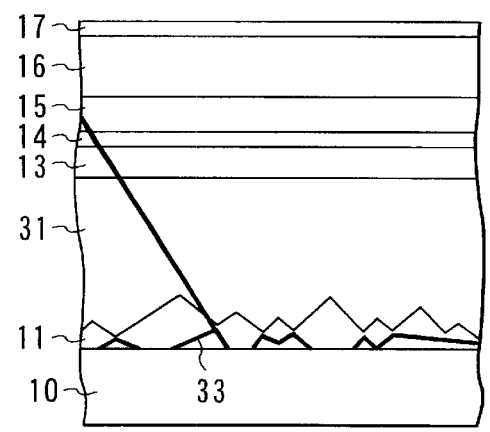
Figure 4:
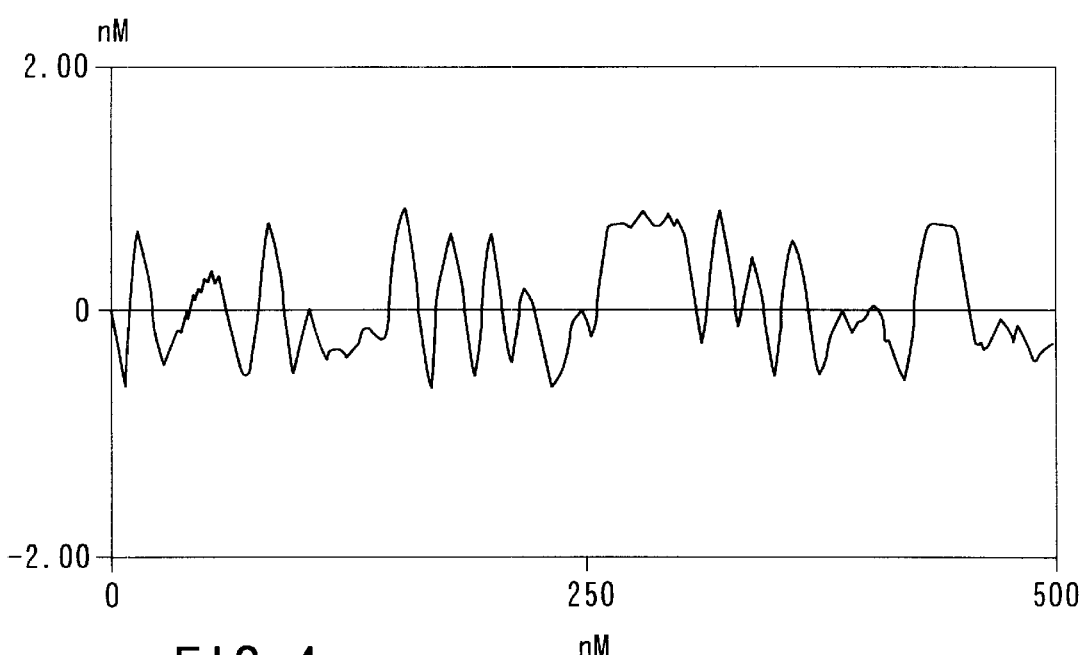
FIG. 4 is a cross-section of an AFM (atomic-force microscope) image of an uneven surface of a Ge sacrifice layer.

Next, the partial pressure of disilane as a source gas is increased to 1 Pa, and a 50 nm-thick undoped amorphous $Si_{0.7}Ge_{0.3}$ layer 31 is grown. The annealing is performed in a hydrogen atmosphere for 10 min at 600° C. During the annealing, crystallization starts in the amorphous layer 31 from a portion in contact with the Ge layer 11 to form a crystal layer 32. When the crystal layer 32 becomes several nm thick, a threading dislocation 33 is generated at a stress concentrated portion of the boundary region 30. When the crystal layer 32 further grows, the dislocations 33 are grown and are connected each other around the boundary regions of the Ge islands in a direction parallel to the substrate, as shown in FIG. 3C.

After the amorphous layer is completely crystallized to form the relaxed undoped $Si_{0.7}Ge_{0.3}$ buffer layer 12, the partial pressure of disilane is returned to the normal epitaxial condition ($2.5 \times 10^{-2}$ Pa), and the carrier supply layer 13, spacer layer 14, channel layer 15, and cap layers 16 and 17 are sequentially stacked.

After this, an FET is formed by forming a source, a drain, and a gate on the wafer by ion implantation or metallization. This manufacturing process is generally used, and a detailed description thereof will be omitted. To prevent the strained silicon layer from being relaxed to generate dislocation, the upper limit of process temperature must be suppressed to about 850° C.

In this embodiment, the conventional CVD is used for the upper structure from the carrier supply layer. However, all layers on the surface side of the sacrifice layer 11 may be formed as amorphous layers first and then crystallized by annealing process. Furthermore, the spacer layer 14 and carrier supply layer 13 may be stacked on the strained Si channel layer 15. In this case, the relaxed undoped $Si_{0.7}Ge_{0.3}$ buffer layer 12, undoped strained Si channel layer 15, undoped $Si_{0.7}Ge_{0.3}$ spacer layer 14, n-type $Si_{0.7}Ge_{0.3}$ carrier supply layer 13 and undoped $Si_{0.7}Ge_{0.3}$ cap layer 16 are sequentially stacked on the Si substrate 10.

[Second Embodiment]

FIG. 6 is a sectional view showing a semiconductor device according to the second embodiment of the present invention. The same reference numerals as in FIG. 2 denote the same parts in FIG. 6, and a detailed description thereof will be omitted. The semiconductor device of this embodiment is a CMOS inverter using a strained Si layer as p- and n-channels.

An n-type Ge sacrifice layer 11a, an n-type relaxed $Si_{0.7}Ge_{0.3}$ layer 12a, and an n-type strained silicon layer 15a are formed on an n-type Si substrate 10. A p-type well is formed in a predetermined region by ion implantation, and a p-type Ge sacrifice layer 11b, a p-type relaxed $Si_{0.7}Ge_{0.3}$ layer 12b, and a p-type strained silicon layer 15b are formed. Reference numeral 55 denotes an insulating film.

In the CMOS shown in FIG. 6, a source 51a and the n-type relaxed layer 12a of the p-MOS are biased to 3V through an interconnection 57a. A source 52a and the p-type relaxed layer 12b of the n-MOS are connected to the ground through an interconnection 57c. An input voltage is applied to gates 54a and 54b of the two MOSs, and output voltages are output from a drain 51b of the p-MOS and a drain 52b of the n-MOS.

This CMOS has the same arrangement as that of a conventional Si-CMOS except for substrate structure, and a detailed description thereof will be omitted.

[Third Embodiment]

In this embodiment, a MOS structure (HMOS) having a channel at the heterointerface is used in place of the conventional MOS structure.

Figure 7:
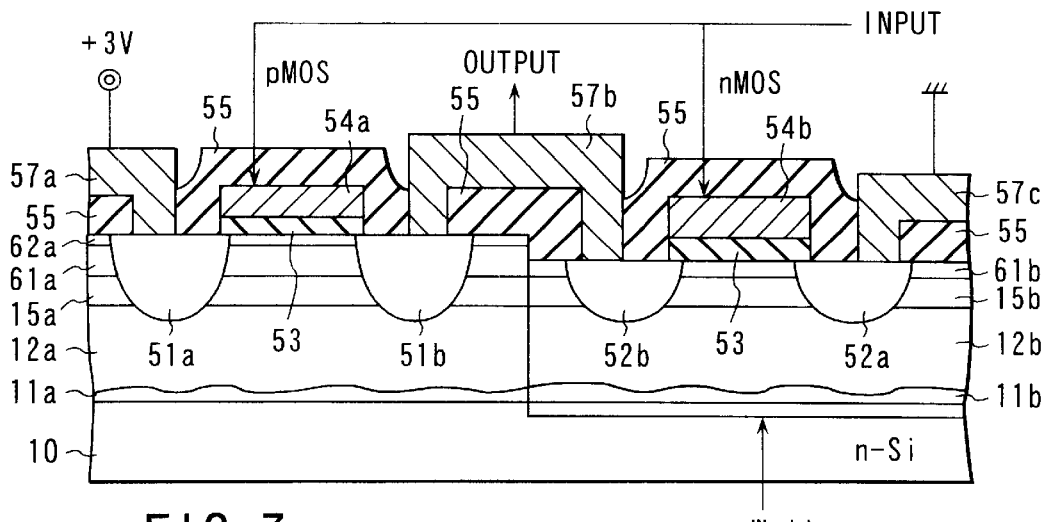
FIG. 7 is a sectional view showing the arrangement of a semiconductor device according to the third embodiment.

FIG. 7 is a sectional view showing principal part of a semiconductor device having an HMOS structure according to the third embodiment. The same reference numerals as in FIGS. 2 and 5 denote the same parts in FIG. 7, and a detailed description thereof will be omitted.

For an n-HMOS, a p-type strained $Si_{0.3}Ge_{0.7}$ layer 61b having a thickness of 5 nm is inserted between a strained Si layer 15b and a gate oxide film 53.

For a p-HMOS, an n-type strained $Si_{0.3}Ge_{0.7}$ layer 61a having a thickness of 10 nm, which is shared by the n-MOS, and a strained (tensilely strained) Si layer 62a having a thickness of 5 nm are inserted between a strained Si layer 15a and the gate oxide film 53. The difference in thickness between the n-type strained $Si_{0.3}Ge_{0.7}$ layer 61a and p-type strained $Si_{0.3}Ge_{0.7}$ layer 61b corresponds to the consumed amount in forming the gate oxide film 53 of the n-HMOS.

In this case, an n-channel is formed near the interface between the strained Si layer 15b and strained $Si_{0.3}Ge_{0.7}$ layer 61b. A p-channel is formed between the $Si_{0.3}Ge_{0.7}$ layer 61a and strained Si layer 62a. It is preferable that Ge compositions of the buffer layers 12a and 12b are 0.5 to 0.7.

As a modification of this embodiment, a modulation doped structure as in the first embodiment may be used. In this case, p- and n-type $Si_{0.3}Ge_{0.7}$ carrier supply layers must be formed on or below the p- and n-channels. It is also possible to insert a $Si_{0.3}Ge_{0.7}$ spacer layer between the carrier supply layer and the channels.

The present invention is not limited to the above embodiments. For example, as the sacrifice layer, $Si_{1-x}Ge_x$ ($1 \geq x > 0$) can be used. As the buffer layer, $Si_{1-y}Ge_y$ ($x \neq y$) can be used. More preferably, the sacrifice layer may be a $Si_{1-x}Ge_x$ ($0.7 \leq x \leq 1$), buffer layer be a $Si_{1-y}Ge_y$ ($0.2 \leq y \leq 0.4$), spacer layer be a $Si_{1-x}Ge_x$ spacer layer ($0.2 \leq x \leq 0.4$) and carrier supply layer be a $Si_{1-x}Ge_x$ layer ($0.2 \leq x \leq 0.4$).

Furthermore, in the buffer layer, "y" is not limited to constant value, and "y" can gradually change in a film thickness direction. As the channel layer, $Si_{1-z}Ge_z$ ($z \neq y$) can be used.

Except the above-described combinations, combinations such as GaAs (first semiconductor layer)/InAs (second semiconductor layer)/InGaAs (third semiconductor layer)/InGaAs (strained semiconductor layer), GaAs (first semiconductor layer)/InP (second semiconductor layer)/InGaAs (third semiconductor layer)/InGaAs (strained semiconductor layer), and InP (first semiconductor layer)/InGaP (second semiconductor layer)/InGaP (third semiconductor layer)/InGaAs (strained semiconductor layer) can be used.

Figure 8:
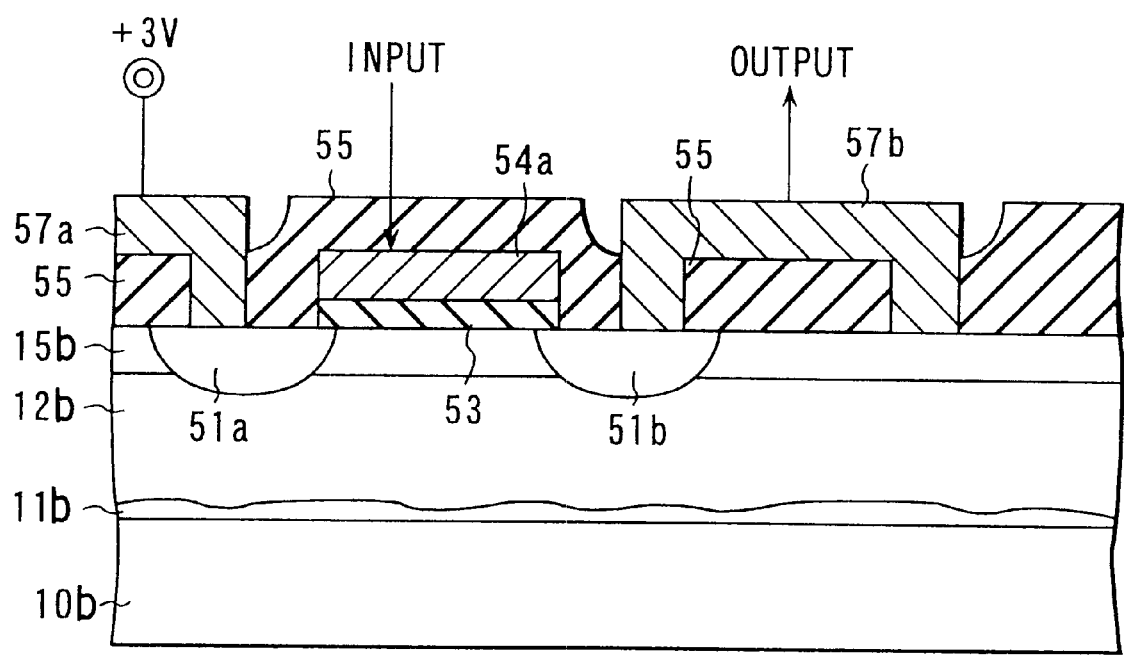
FIG. 8 is a sectional view showing a n-MOS to which the present invention is applied.

In the second embodiment, a CMOS inverter has been described. However, as shown in FIGS. 8 and 9, the present invention can also be applied to a single MOSFET. The same reference numerals as in FIG. 6 denote the same parts in FIGS. 8 and 9.

FIG. 8 shows a n-MOS to which the present invention is applied.

As shown in FIG. 8, in the n-MOS, an p-type Ge sacrifice layer 11b, a p-type relaxed $Si_{0.7}Ge_{0.3}$ layer 12b, and a p-type strained silicon layer 15b as a channel layer are sequentially formed on a p-type Si substrate 10b.

Various changes and modifications can be made without departing from the spirit and scope of the invention.

As has been described above, according to the present invention, a strained Si or SiGe layer with high productivity and dislocation density lower than that of the prior art can be obtained. As a consequence, low power consumption and high-speed operation as compared to the conventional Si electronic device can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CMOS circuit comprising:

a Ge sacrifice layer formed on a silicon substrate, wherein the Ge sacrifice layer has an uneven surface and a lattice constant different from that of said silicon substrate;

an n-type buffer layer formed on the uneven surface of said Ge sacrifice layer;

a p-type buffer layer formed on the uneven surface of said Ge sacrifice layer;

an n-type strained silicon layer formed above said n-type buffer layer and having a lattice constant different from that of said n-type buffer layer;

a p-type strained silicon layer formed above said p-type buffer layer and having a lattice constant different from that of said p-type buffer layer;

an n-type SiGe layer formed on said n-type strained silicon layer, a strained Si layer formed on said n-type SiGe layer, and a p-type strained SiGe layer formed on said p-type strained silicon layer.

2. A CMOS circuit according to claim 1, wherein the uneven surface comprises islands that are tightly adjacent to each other.

* * * * *